(12) United States Patent
Shan

(10) Patent No.: US 11,181,795 B2
(45) Date of Patent: Nov. 23, 2021

(54) ARRAY SUBSTRATE AND LIQUID CRYSTAL DISPLAY PANEL

(71) Applicant: HKC CORPORATION LIMITED, Guangdong (CN)

(72) Inventor: Jianfeng Shan, Guangdong (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 17/035,701

(22) Filed: Sep. 29, 2020

(65) Prior Publication Data

US 2021/0011348 A1 Jan. 14, 2021

Related U.S. Application Data

(63) Continuation of application No. PCT/CN2018/105084, filed on Sep. 11, 2018.

(30) Foreign Application Priority Data

Jul. 17, 2018 (CN) .......................... 201821132649.9

(51) Int. Cl.
*G02F 1/1362* (2006.01)
*G02F 1/1335* (2006.01)
(Continued)

(52) U.S. Cl.
CPC ...... *G02F 1/136286* (2013.01); *G02F 1/1368* (2013.01); *G02F 1/133514* (2013.01);
(Continued)

(58) Field of Classification Search
CPC ................ H01L 27/124; G09G 3/3648; G09G 2300/0426; G09G 2310/0202;
(Continued)

(56) References Cited

U.S. PATENT DOCUMENTS

2006/0120160 A1* 6/2006 Park ..................... G09G 3/3648
365/185.22
2009/0273592 A1 11/2009 Chien et al.
(Continued)

FOREIGN PATENT DOCUMENTS

CN 105336304 A 2/2016
CN 106710538 A 5/2017
(Continued)

*Primary Examiner* — Mariam Qureshi

(57) ABSTRACT

The present disclosure relates to an array substrate and a liquid crystal display panel. The array substrate includes a base, an active element array, a plurality of scanning lines and a plurality of data lines. The base includes an intermediate region and an edge region. The active element array is disposed in the intermediate region. The plurality of scanning lines are sequentially disposed and all extend along a first direction, each scanning line includes a first connecting segment, a second connecting segment and a third connecting segment, the connecting segments are sequentially connected, the first connecting segment and the third connecting segment are parallel, the first connecting segment passes through the intermediate region, and the second connecting segment and the third connecting segment are both disposed in the edge region. The plurality of data lines are sequentially disposed, and all extend along a second direction perpendicular to the first direction.

7 Claims, 3 Drawing Sheets

(51) Int. Cl.
*G02F 1/1368* (2006.01)
*H01L 27/12* (2006.01)
*G09G 3/36* (2006.01)

(52) U.S. Cl.
CPC ......... *H01L 27/124* (2013.01); *G09G 3/3648* (2013.01); *G09G 2300/0426* (2013.01); *G09G 2310/0202* (2013.01)

(58) Field of Classification Search
CPC ............... G09G 3/3659; G09G 3/3677; G09G 2310/0262; G09G 2300/0408; G02F 1/1368; G02F 1/136286; G02F 2001/136295; G02F 1/136295
See application file for complete search history.

(56) References Cited

U.S. PATENT DOCUMENTS

| | | | |
|---|---|---|---|
| 2011/0267572 A1* | 11/2011 | Chen | G02F 1/136286 349/143 |
| 2014/0307187 A1* | 10/2014 | Hsiao | H04N 13/337 349/15 |

FOREIGN PATENT DOCUMENTS

| | | | |
|---|---|---|---|
| CN | 106950772 A | 7/2017 | |
| CN | 106991953 A | 7/2017 | |
| TW | 201042625 A1 | 12/2010 | |

\* cited by examiner

1

ARRAY SUBSTRATE AND LIQUID CRYSTAL DISPLAY PANEL

CROSS-REFERENCE OF RELATED APPLICATIONS

The present application is a continuation application of International Patent Application with No. PCT/CN2018/105084, filed on Sep. 11, 2018, which claims the benefit of a Chinese Patent Application with No. 201821132649.9, titled "ARRAY SUBSTRATE AND LIQUID CRYSTAL DISPLAY PANEL", filed in the National Intellectual Property Administration, PRC on Jul. 17, 2018, the entirety of which is hereby incorporated by reference.

FIELD

The disclosure relates to the field of display technology, and in particular, relates to an array substrate and a liquid crystal display panel.

BACKGROUND

Liquid Crystal Display (LCD) has many advantages, such as, having thin body, power saving, and no radiation, and has been widely used in that, for example, liquid crystal television, mobile phone, personal digital assistant (PDA), digital camera, computer screen, or notebook computer screen. LCD is dominant in the field of flat panel display.

In a LCD panel of Half Source Driving (HSD) architecture, data lines needed for driving the panel are reduced by making two adjacent pixels share one data line, thus the production cost is reduced. The account of scanning lines is doubled while reducing the data lines by half. Because adjacent two scanning lines are too close, signal will be interfered, and accurate results cannot be obtained when the non-contact Array Test is used to detect whether the circuits have an open circuit. That is, in the situation that one scanning line is open and its adjacent scanning line is normal, normal detection results can be obtained when detecting both lines by using the non-contact Array Test. Therefore, the detection error rate increases and the accuracy of the detection results decreases.

SUMMARY

The disclosure provides an array substrate and a liquid crystal display panel, which is to avoid causing signal interference between two adjacent scanning lines during testing.

The disclosure provides an array substrate, which includes a substrate, an active element array, a plurality of scanning lines and a plurality of data lines. The base includes an intermediate region and an edge region. The active element array is disposed in the intermediate region. The plurality of scanning lines electrically connect the active element array, the plurality of scanning lines are sequentially disposed and all extend along a first direction, each scanning line includes a first connecting segment, a second connecting segment and a third connecting segment sequentially connected, the first connecting segment and the third connecting segment are parallel, the second connecting segment is between and perpendicularly connected with the first connecting segment and the third connecting segment, the first connecting segment passes through the intermediate region, and the second connecting segment and the third connecting segment are both disposed in the edge region. the plurality of data lines are insulated from the plurality of scanning lines, and electrically connects the active element array, the plurality of data lines are sequentially disposed, and all extend along a second direction perpendicular to the first direction.

In one embodiment of the present disclosure, the array substrate employs a half source driving architecture.

In one embodiment of the present disclosure, the active element array is a thin film transistor array, the thin film transistor array includes a plurality of thin film transistors disposed in an array, both sides of each data line electrically connect a plurality of thin film transistors, one side of each scanning line electrically connects a plurality of thin film transistors, and the other side of each scanning line is adjacent to another scanning line.

In one embodiment of the present disclosure, the array substrate also includes a pixel electrode array, the pixel electrode array includes a plurality of pixel electrodes corresponding to a plurality of thin film transistors respectively, each thin film transistor includes a source electrode, a drain electrode and a gate electrode, the gate electrode of each thin film transistor electrically connect one scanning line, the source electrode of each thin film transistor electrically connect one data line, the drain electrode of each thin film transistor electrically connect one pixel electrode.

In one embodiment of the present disclosure, the pixel electrode array and the thin film transistor array are disposed in different layers, and the drain electrode of each thin film transistor electrically connects to one pixel electrode through a guide hole.

In one embodiment of the present disclosure, the edge region includes a first side region, a second side region, a third side region and a fourth side region, the regions are connected end to end, the first side region and the third side region are disposed in a pair of opposite sides of the intermediate region, the second side region and the fourth side region are disposed in another pair of opposite sides of the intermediate region, the plurality of scanning lines extend from the first side region to the third side region, the plurality of data lines extend from the second side region to the fourth side region.

In one embodiment of the present disclosure, the plurality of scanning lines are recorded as a first scanning line, a second scanning, and accounting to the Nth scanning line, N is a natural number, the first scanning line is close to the fourth side region, the Nth scanning line is close to the second side region, the third connecting segment of an odd-numbered scanning line is closer to the second side region in comparison with the first connecting segment of the odd-numbered scanning line, the third connecting segment of an even-numbered scanning line is closer to the fourth side region in comparison with the first connecting segment of the odd-numbered scanning line.

In one embodiment of the present disclosure, lengths of the second connecting segments of the scanning lines are equal.

In one embodiment of the present disclosure, in each scanning line, the second connecting segment is perpendicular to the first connecting segment and the third connecting segment.

In one embodiment of the present disclosure, in each scanning line, the second connecting segment slantingly intersects with the first connecting segment and the third connecting segment.

In one embodiment of the present disclosure, in each scanning line, the included angle between the second connecting segment and the first connecting segment is 120 to 160 degrees.

In one embodiment of the present disclosure, in each scanning line, the second connecting segment connects the first connecting segment and the third connecting segment by an arc segment.

In one embodiment of the present disclosure, spacing distance between the third connecting segments of two adjacent scanning lines are equal.

The present disclosure provides an array substrate, which includes a substrate, a thin film transistor array, a plurality of scanning lines and a plurality of data lines. The base includes an intermediate region, a first side region, a second side region, a third side region and a fourth side region. The thin film transistor array includes a plurality of thin film transistors disposed in an array and in the intermediate region. The plurality of data lines extend from the second side region to the fourth side region, both sides of each data line electrically connect a plurality of thin film transistors. The plurality of scanning lines extend from the first side region to the third side region, only one side of each scanning line electrically connects a plurality of thin film transistors, and the other side of each scanning line is adjacent to another scanning line, each scanning line includes a first connecting segment, a second connecting segment and a third connecting segment, the connecting segments are sequentially connected, the first connecting segment and the third connecting segment are parallel and not collinear, the second connecting segment connects the first connecting segment and the third connecting segment, the first connecting segment is disposed in the first side region and the intermediate region, the second connecting segment and the third connecting segment are both disposed in the third side region, and spacing distance between the third connecting segments of two adjacent scanning lines are equal.

In one embodiment of the present disclosure, the plurality of scanning lines are recorded as a first scanning line, a second scanning, and accounting to the Nth scanning line, N is a natural number, the first scanning line is close to the fourth side region, the Nth scanning line is close to the second side region, the third connecting segment of odd-numbered scanning line is closer to the second side region in comparison with the first connecting segment of the odd-numbered scanning line, the third connecting segment of even-numbered scanning line is closer to the fourth side region in comparison with the first connecting segment of the odd-numbered scanning line.

In one embodiment of the present disclosure, in each scanning line, the second connecting segment perpendicularly or slantingly connects the first connecting segment and the third connecting segment.

In one embodiment of the present disclosure, in each scanning line, the second connecting segment connects the first connecting segment and the third connecting segment by an arc segment.

The present disclosure provides a liquid crystal display panel, which includes an array substrate, a color filter substrate, and a liquid crystal layer disposed between the array substrate and the color filter substrate. The array substrate includes a base, an active element array, a pixel electrode array, a plurality of scanning lines and a plurality of data lines. The base includes an intermediate region and an edge region. The active element array includes a plurality of active elements disposed in an array. The pixel electrode array includes a plurality of pixel electrodes which electrically and correspondingly connect a plurality of active elements. Both sides of each data line electrically connect a plurality of active elements. Only one side of each scanning line electrically connects a plurality of active elements, the other side of each scanning line is adjacent to another scanning line. Each scanning line includes a first connecting segment, a second connecting segment and a third connecting segment, the connecting segments are sequentially connected, the first connecting segment and the third connecting segment are parallel and not collinear, and the second connecting segment connects the first connecting segment and the third connecting segment. The first connecting segment passes through the intermediate region, and the second connecting segment and the third connecting segment are both disposed in the edge region. The color filter substrate includes a plurality of photoresists, and the plurality of photoresists correspond to the plurality of pixel electrodes respectively.

In one embodiment of the present disclosure, spacing distance between the third connecting segments of two adjacent scanning lines are equal.

In one embodiment of the present disclosure, in each scanning line, the second connecting segment is between and perpendicularly connected with the first connecting segment and the third connecting segment.

In the above array substrate and liquid crystal display panel, the distances between the ends of two adjacent scanning lines are adjusted by designing the scanning lines, making the distance between the ends of two scanning lines that are too close to each other increased, and the distance between the ends of two scanning lines that are too far away reduced. Thereby, the distances between the ends of adjacent scanning lines are made more uniform, thus reducing the mutual interference of detection signals and improving the accuracy of detection results.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only about some embodiments of the present invention, and persons of ordinary skill in the art can derive other drawings from the accompanying drawings without creative efforts.

DETAILED DESCRIPTION OF THE EMBODIMENTS

Figure 1:
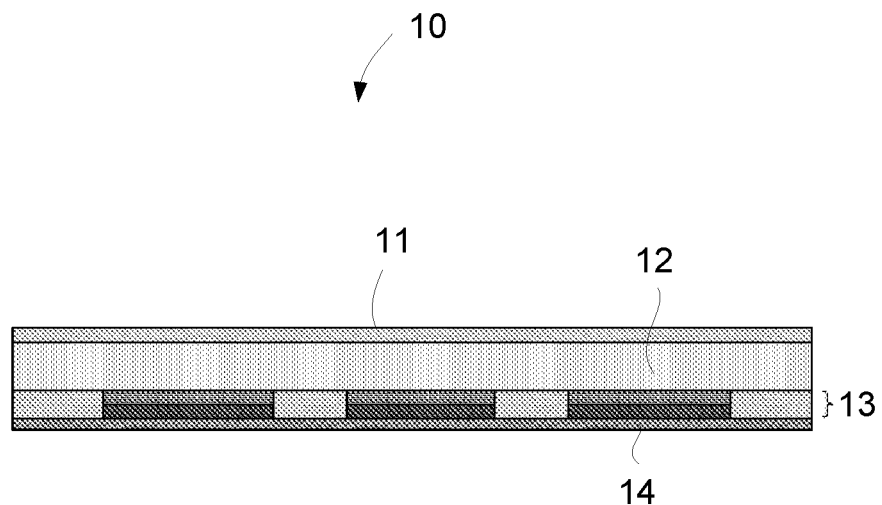
FIG. 1 is a partial cross-sectional diagram of an array substrate in one embodiment of the present disclosure.

In order to make the purpose, technical scheme and advantages of the disclosed embodiments more clear, the technical scheme in the disclosed embodiments will be described clearly and completely below in conjunction with the drawings in the disclosed embodiments. Obviously, the described embodiments are region of the disclosed embodiments, not all embodiments. All other embodiments obtained by persons skilled in the art based on the embodiments of the present disclosure without creative efforts shall fall within the protection scope of the present disclosure.

The following description of various embodiments refers to the appended drawings to illustrate specific embodiments in which the present disclosure may be implemented. The directional terms mentioned in this disclosure, such as "up", "down", "front", "back", "left", "right", "inside", "outside" and "side" are only the directions referring to the appended drawings. Therefore, directional terms are used to illustrate and understand the present disclosure, not to limit the present disclosure.

The drawings and description are to be considered as illustrative in nature and not restrictive. In the drawings, elements with similar structures are denoted by the same reference labels. In addition, the size and thickness of each component shown in the drawings are arbitrarily shown for understanding and convenience of description, but the present disclosure is not limited thereto.

In addition, in the specification, unless explicitly described to the contrary, the word "comprising" will be understood to mean including the described components, but not excluding any other components. Furthermore, in the specification, "on . . . " means above or below the target assembly, and does not mean that it must be on top based on the direction of gravity.

In order to further illustrate the technical means employed and efficacy obtained by the present disclosure when to achieve the intended purpose of disclosure, the specific implementation, structure, features and efficacy of an array substrate and a liquid crystal display panel according to the present disclosure will be described in detail below with reference to the accompanying drawings and preferred embodiments.

Figure 2:
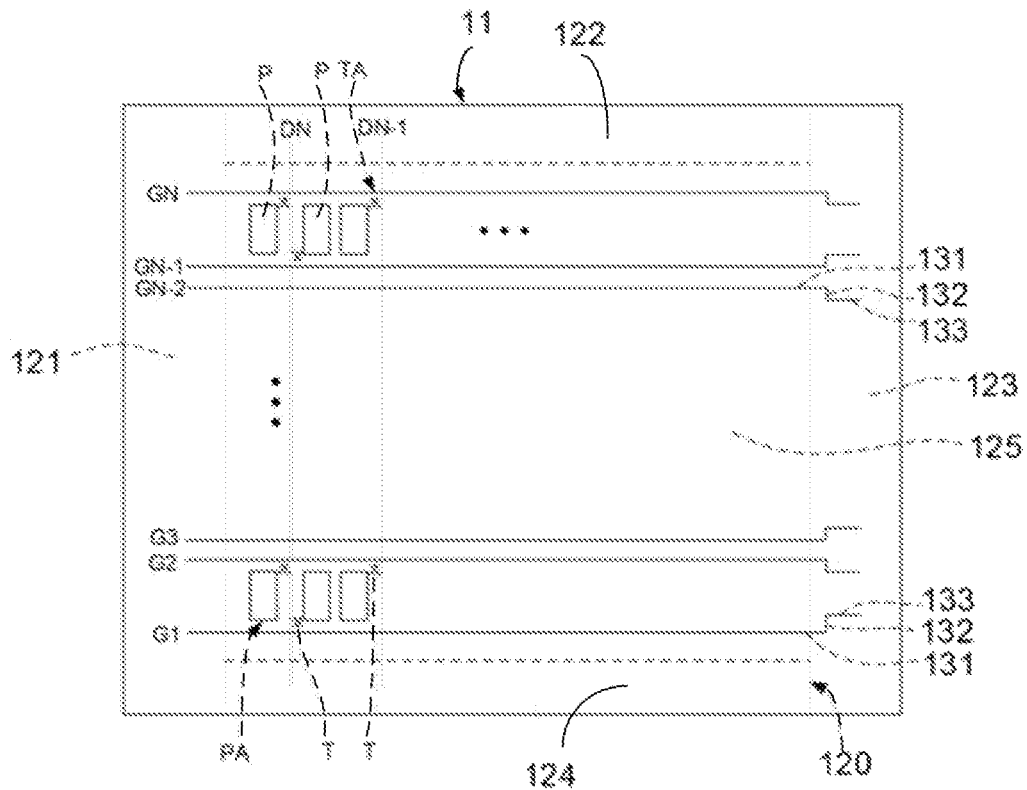
FIG. 2 is a partial top view diagram of a pixel structure layer defined on the glass substrate of an array substrate in one embodiment of the present disclosure.

As shown in FIGS. 1 and 2, an array substrate 10 provided in one embodiment of the present disclosure includes and defines sequentially a first polarizer 11, a base 12, a pixel structure layer 13, and a first alignment layer 14. The material of the first alignment layer 14 is generally polyimide (PI).

The base 12 is generally a glass substrate, and surely other substrates may be used. The base 12 includes an intermediate region 125 and an edge region 120 surrounding the intermediate region 125. The edge region 120 includes a first side region 121, a second side region 122, a third side region 123, and a fourth side region 124, being connected end to end. The first side region 121 and the third side region 123 are disposed in another pair of opposite sides of the intermediate region 125. The second side region 122 and the fourth side region 124 are disposed in another pair of opposite sides of the intermediate region 125.

The pixel structure layer 13 includes a plurality of scanning lines a plurality of data lines D, an active element array TA and a pixel electrode array PA. The active element array TA corresponds to the intermediate region 125 and includes a plurality of active elements T disposed in an array. Those skilled in the art will understand that the active element T may be a type of bottom gate electrode thin film transistor, top gate type thin film transistor, or other applicable transistors, electron tubes, integrated circuits, etc. In the present disclosure, only a thin film transistor is described as an example, but the active element is not limited thereto. That is, in this embodiment, the active element array TA is a thin film transistor array, and the thin film transistor array includes a plurality of thin film transistors T, each thin film transistor includes a gate electrode, a drain electrode and a source electrode.

The plurality of the scanning lines G are sequentially disposed and all extend along a first direction, that is, from the first side region 121 to the third side region 123. Each scanning line G includes a first connecting segment 131, a second connecting segment 132, and a third connecting segment 133, the connecting segments are sequentially connected. The first connecting segment 131 and the third connecting segment 133 are parallel and not collinear. The second connecting segment 132 is between and perpendicularly connected with the first connecting segment 131 and the third connecting segment 133. The first connecting segment 131 passes through the intermediate region 125 from the first side region 121, that is, the first connecting segment 131 is substantially disposed at the first side region 121 and the intermediate region 125. The second connecting segment 132 and the third connecting segment 133 are both disposed in the third side region 123.

The plurality of the data lines D are sequentially disposed and each data line extends along a second direction perpendicular to the first direction, that is, from the second side region 122 to the fourth side region 124. The plurality of data lines D and the plurality of scanning lines G are disposed in different film layers and are insulated from each other.

The scanning line G and the data line D are both used for transmitting driving signals. The scanning line S and the data line D are generally made by etching the metal conductive layer. The gate electrode is electrically connected with the scanning line and the source electrode is electrically connected with the data line D. That is, when a control signal is input to the scanning line the scanning line G electrically connects the gate electrode, and when a control signal is input to the data line D, the data line D electrically connects the source.

The pixel electrode array PA includes a plurality of pixel electrodes P disposed in an array, which can be made of transparent conductive layers through photo etching. The material of the pixel electrode is generally indium tin oxide, indium zinc oxide, tin oxide, aluminum zinc oxide, or indium germanium zinc oxide, etc. The pixel electrode P correspondingly and electrically connects the thin film transistor T. Specifically, the drain electrode is connected to a wire disposed on the same layer, and the pixel electrode P is disposed on the upper layer of the wire and electrically connected to the wire through the guide hole, thus realizing the electrical connection between the pixel electrode P and the thin film transistor T.

The array substrate 10 employs a half source driving architecture, also known as a source electrode half-decreased driving architecture. Specifically, both sides of each data line are electrically connected with a plurality of thin film transistors, and each data line D is configured for charging the left and right columns of pixels. One side of each scanning line G electrically connects a plurality of thin film transistors, and the other side of each scanning line G is adjacent to another scanning line G The plurality of scanning lines G are recorded as a first scanning line G1, a second scanning G2, and accounting to the Nth scanning line GN, N is a natural number, the first scanning line G1 is closest to the fourth side region 124, the Nth scanning line is closest to the second side region 122, the third connecting segment 133 of odd-numbered scanning line G is closer to the second side region 122 in comparison with the first connecting segment 131 of the odd-numbered scanning line the third connecting segment 133 of odd-numbered scanning line G is closer to the second side region 124 in comparison with the first connecting segment 131 of the odd-numbered scanning line G Spacing distance of the third connecting segments 133 of the plurality of scanning lines G are equal or not equal. Alternatively, lengths of the second connecting segments 132 are equal. Alternatively, spacing distance of the third connecting segments 133 of the plurality of scanning lines G are equal. Alternatively, lengths of the second connecting segment are 3 microns to 10 microns.

FIG. 2 only schematically depicts the local scanning line the local data line D, the local thin film transistor, and the local pixel electrode P. Those skilled in the art may understand the distribution rules and technical features of the above-mentioned elements.

Figure 3:
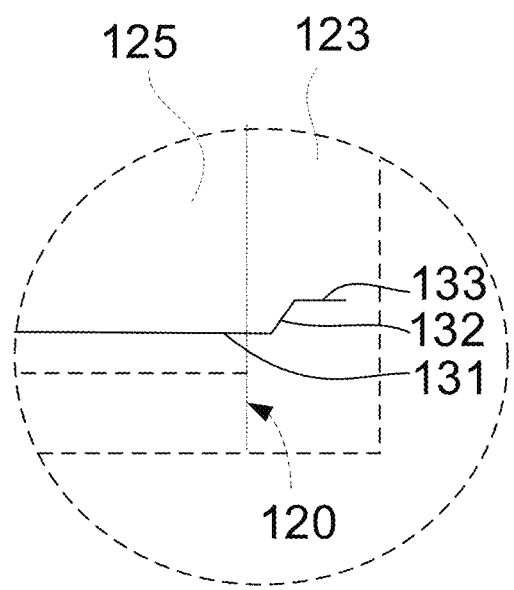
FIG. 3 is a locally enlarged diagram of a scanning line defined on the glass substrate of an array substrate in another embodiment of the present disclosure.

Referring to FIG. 3, the pixel structure layer defined on the glass substrate of an array substrate according to another embodiment of the present disclosure is slightly different from that of FIG. 2. The difference is that the first connecting segment and the third connecting segment of each scanning line G are slantingly connected rather than perpendicularly connected. Specifically, each scanning line G includes a first connecting segment 131, a second connecting segment 132, and a third connecting segment 133, the connecting segments are sequentially connected. The first connecting segment 131 and the third connecting segment 133 are parallel and not collinear. The second connecting segment 132 is between and slantingly connected with the first connecting segment 131 and the third connecting segment 133. The second connecting segment 132 forms obtuse included angles with the first connecting segment 131 and the third connecting segment. The included angles may be 120 degrees to 160 degrees. The first connecting segment 131 passes through the intermediate region 125 from the first side region 121, that is, the first connecting segment 131 is substantially disposed at the first side region 121 and the intermediate region 125. The second connecting segment 132 and the third connecting segment 133 are both disposed in the third side region 123.

Figure 4:
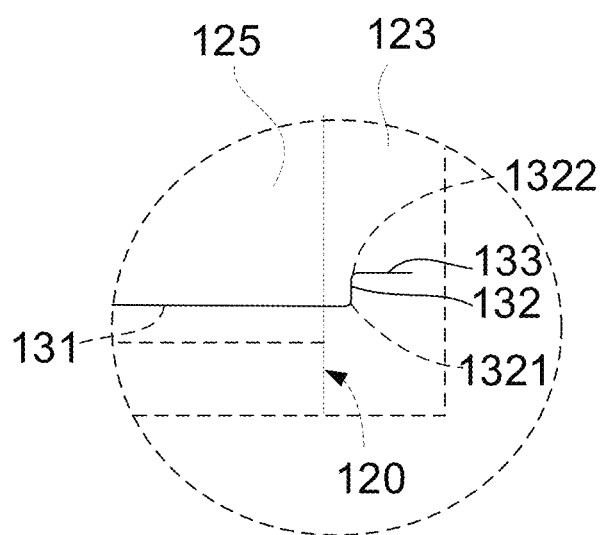
FIG. 4 is a locally enlarged diagram of a scanning line defined on the glass substrate of an array substrate in still another embodiment of the present disclosure.

Referring to FIG. 4, the pixel structure layer defined on the glass substrate of an array substrate according to another embodiment of the present disclosure is slightly different from that of FIG. 2. The difference is that a second connecting segment 132 of each scanning line G is connected with a first connecting segment 131 and a third connecting segment by arc connection. Specifically, each scanning line G includes a first connecting segment 131, a second connecting segment 132, and a third connecting segment 133, the connecting segments are sequentially connected. The first connecting segment 131 and the third connecting segment 133 are parallel and not collinear. The second connecting segment 132 is between and connected with the first connecting segment 131 and the third connecting segment 133. The second connecting segment 132 is perpendicular to the first connecting segment 131 and the third connecting segment. The second connecting segment 132 is connected with the first connecting segment 131 by a first arc segment 1321. The second connecting segment 132 is connected with the third connecting segment 133 by a second arc segment 1322. The lengths of the first arc segment 1321 and the second arc segment 1322 are very small, and the ratio of the length of the arc segments to the length of the second connecting segment 132 is less than 0.1. The first connecting segment 131 passes through the intermediate region 125 from the first side region 121, that is, the first connecting segment 131 is substantially disposed at the first side region 121 and the intermediate region 125. The second connecting segment 132 and the third connecting segment 133 are both disposed in the third side region 123.

In the two designs of FIG. 3 and FIG. 4, the distances between the ends of two adjacent scanning lines are also adjusted by designing the scanning lines, making the distance between the ends of two scanning lines that are too close to each other increased, and the distance between the ends of two scanning lines that are too far away reduced. Thereby, the distances between the ends of adjacent scanning lines are made more uniform, thus reducing the mutual interference of detection signals and improving the accuracy of detection results.

Those skilled in the art may understand that design of the scanning line ends is not limited to the three designs of FIG. 2, FIG. 3 and FIG. 4, but there may be other equivalent changes or other schemes derived from the same design spirit of adding scanning line end.

Figure 5:
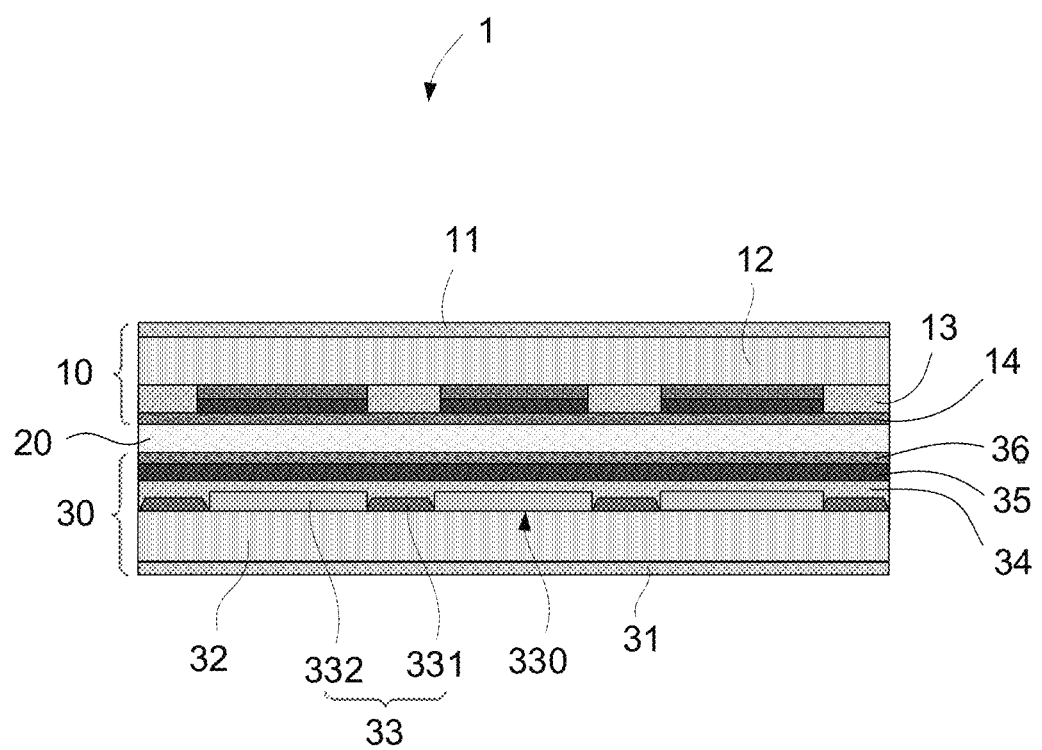
FIG. 5 is a partial cross-sectional diagram of a liquid crystal display panel in one embodiment of the present disclosure.

Referring to FIG. 5, a liquid crystal display panel 1 provided in one embodiment of the present disclosure includes an array substrate 10, a liquid crystal layer 20, and a color filter substrate 30, as described above.

The color filter substrate 30 sequentially defines and includes a second polarizer 31, a glass substrate 32, a color filter layer 33, a protective layer 34, a transparent conductive layer 35 and a second alignment layer 36. The color filter layer 33 includes a black matrix 331 and a plurality of photoresists 332, and each photoresist 332 corresponds to one pixel electrode P. In general, the photoresist 332 includes a red photoresist R, a green photoresist and a blue photoresist B. The black matrix 331 is disposed on the surface of the glass substrate 32 and includes a plurality of transverse light-shielding bars and a plurality of longitudinal light-shielding bars. The plurality of transverse light-shielding bars and the plurality of longitudinal light-shielding bars perpendicularly intersect to form a plurality of openings 330, each opening 330 corresponds to one photoresist 332, i.e., each photoresist 332 is disposed in one opening 330 and corresponds to one pixel electrode P. The transparent conductive layer 35 is generally made of indium tin oxide and functions as a common electrode.

The liquid crystal layer 20 is disposed between the array substrate 10 and the color filter substrate 30, specifically between the first alignment layer 14 and the second alignment layer 36. Alternatively, a plurality of spacers are also defined between the first alignment layer 14 and the second alignment layer 36 so that an appropriate gap is maintained between the base 12 and the glass base 32. Alternatively, a frame is also defined between the edge of the array substrate 10 and the edge of the color filter substrate 30 to seal the liquid crystal layer 20.

In the array substrate 10 and the liquid crystal display panel 1 described above, by designing the scanning lines the distance between the ends of two adjacent scanning lines G may be adjusted, making the distance between the ends of two scanning lines G that are too close to each other increased, and the distance between the ends of two scanning lines G that are too far away reduced. Thereby, the distances between the ends of adjacent scanning lines G are made more uniform, thus reducing the mutual interference of detection signals and improving the accuracy of detection results.

The terms "in some embodiments" and "in various embodiments" are repeatedly used. The term generally does not refer to the same embodiment; but it may also refer to the same embodiment. The words "comprising", "having" and "including" are synonyms unless the context shows other meanings.

The above is only the preferred embodiment of the present disclosure, and is not intended to limit the present disclosure in any form. Although the present disclosure has been disclosed with specific embodiments, it is not intended to limit the present disclosure. Any person skilled in the art may derive equivalent embodiments by making some equivalent changes or modifications basing on the technical content disclosed above, on the premise of no departure from the technical solution of the present disclosure. As long as not departing from the technical content, any simple modifications, equivalent changes and modifications to the above embodiments are still within the scope of the technical solution of the present disclosure.

What is claimed is:

1. An array substrate, comprising:
a base, comprising an intermediate region and an edge region, the edge region comprising a first side region, a second side region, a third side region, and a fourth side region connected end by end, the first side region and the third side region being disposed in a pair of opposite sides of the intermediate region, the second side region and the fourth side region being disposed in another pair of opposite sides of the intermediate region;
an active element array, disposed in the intermediate region;
a plurality of scanning lines, electrically connecting the active element array, wherein the plurality of scanning lines are sequentially disposed and all extended along a first direction, each of the scanning lines comprises a first connecting segment, a second connecting segment, and a third connecting segment connecting sequentially, the first connecting segment is parallel to the third connecting segment, the second connecting segment is connected with the first connecting segment and the third connecting segment, the first connecting segment is passed through the intermediate region from the first side region to the third side region, and the second connecting segment and the third connecting segment are both disposed in the edge region; and
a plurality of data lines, wherein the plurality of data lines are insulated from the plurality of scanning lines, and are electrically connected with the active element array, the plurality of data lines are sequentially disposed, and all extended along a second direction perpendicular to the first direction;
wherein the active element array is a thin film transistor array, the thin film transistor array comprises a plurality of thin film transistors arranged in an array, both sides of each of the data lines electrically are connected with a plurality of thin film transistors, one side of each of the scanning lines is electrically connected with a plurality of thin film transistors, and another side of each of the scanning lines is adjacent to another scanning line;
wherein the plurality of scanning lines are extended from the first side region to the third side region, the plurality of data lines are extended from the second side region to the fourth side region;
wherein the plurality of scanning lines are recorded as a first scanning line, a second scanning, and accounting to an Nth scanning line, N is a natural number, the first scanning line is close to the fourth side region, the Nth scanning line is close to the second side region, the third connecting segment of an odd-numbered scanning line is closer to the second side region in comparison with the first connecting segment of the odd-numbered scanning line, the third connecting segment of an even-numbered scanning line is closer to the fourth side region in comparison with the first connecting segment of the even-numbered scanning line.

2. The array substrate according to claim 1, wherein lengths of the second connecting segments of the plurality of scanning lines are equal.

3. The array substrate according to claim 2, wherein in each scanning line, the second connecting segment is perpendicular to the first connecting segment and the third connecting segment.

4. The array substrate according to claim 2, wherein in each of the scanning line, the second connecting segment is slantingly intersected with the first connecting segment and the third connecting segment.

5. The array substrate according to claim 4, wherein in each of the scanning lines, an included angle between the second connecting segment and the first connecting segment is 120 degrees to 160 degrees.

6. The array substrate according to claim 2, wherein in each of the scanning lines, the second connecting segment is connected with each of the first connecting segment and the third connecting segment by an arc segment.

7. The array substrate according to claim 2, wherein spacing distances between the third connecting segments of two adjacent scanning lines are equal.

* * * * *